(12) United States Patent
Sarwary et al.

(10) Patent No.: US 9,721,058 B2
(45) Date of Patent: Aug. 1, 2017

(54) SYSTEM AND METHOD FOR REACTIVE INITIALIZATION BASED FORMAL VERIFICATION OF ELECTRONIC LOGIC DESIGN

(71) Applicant: Synopsys, Inc., Mountain View, CA (US)

(72) Inventors: Mohamed Shaker Sarwary, San Diego, CA (US); Hans-Jorg Peter, Saint-Egreve (FR); Barsneya Chakrabarti, Noida (IN); Fahim Rahim, Lyons (FR); Mohammad Homayoun Movahed-Ezazi, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/794,549

(22) Filed: Jul. 8, 2015

(65) Prior Publication Data

US 2016/0300009 A1    Oct. 13, 2016

Related U.S. Application Data

(60) Provisional application No. 62/146,927, filed on Apr. 13, 2015.

(51) Int. Cl.
*G06F 17/00* (2006.01)
*G06F 17/50* (2006.01)

(52) U.S. Cl.
CPC ...... *G06F 17/5081* (2013.01); *G06F 17/5045* (2013.01)

(58) Field of Classification Search
USPC .......................................................... 716/106
See application file for complete search history.

(56) References Cited

U.S. PATENT DOCUMENTS

| | | |
|---|---|---|
| 6,311,293 B1 | 10/2001 | Kurshan et al. |
| 6,553,514 B1 | 4/2003 | Baumgartner et al. |
| 7,454,324 B1 | 11/2008 | Seawright et al. |
| 7,454,727 B1 | 11/2008 | Cerny et al. |
| 7,487,483 B2 | 2/2009 | Seawright et al. |
| 7,725,851 B2 | 5/2010 | Eisner et al. |
| 8,103,999 B1 | 1/2012 | Martensson |

(Continued)

OTHER PUBLICATIONS

A. Mishchenko et al., "A Toolbox for Counter-Example Analysis and Optimization", Proceedings, IWLS '13, 2013, 5 pages.

(Continued)

*Primary Examiner* — Mohammed Alam
(74) *Attorney, Agent, or Firm* — Fenwick & West LLP

(57) ABSTRACT

A system and method use reactive initialization to facilitate formal verification of an electronic logic design. The system verifies that a part of the logic design correctly transitions through a sequence of states by automatically assigning an initial state value. The system interacts with a correction-unit to provide meaningful feedback of verification failures, making it possible for the correction-unit to correct the failures or add new constraints that allow the verification to complete. Assigning an initial state simplifies the verification of the validity of the remaining states in the sequence, thus making it more likely to reach a conclusive result and consuming less computing resources.

16 Claims, 4 Drawing Sheets

(56) References Cited

U.S. PATENT DOCUMENTS

| | | | |
|---|---|---|---|
| 8,156,462 | B2 | 4/2012 | Moon |
| 8,244,516 | B2 | 8/2012 | Arbel et al. |
| 8,271,918 | B2 | 9/2012 | Kwok et al. |
| 8,417,507 | B2 | 4/2013 | Arbel et al. |
| 8,448,107 | B2 | 5/2013 | Sheeley et al. |
| 8,539,406 | B2 | 9/2013 | Mahar et al. |
| 8,555,226 | B1 | 10/2013 | Feng et al. |
| 8,806,401 | B1* | 8/2014 | Sarwary ............... G06F 17/504 703/16 |
| 8,826,201 | B1* | 9/2014 | Hanna ................ G06F 17/5045 716/104 |
| 2005/0261885 | A1 | 11/2005 | Busch |
| 2006/0089827 | A1* | 4/2006 | Gabele ............... G06F 17/5022 703/17 |
| 2011/0046938 | A1* | 2/2011 | Morizawa .......... G06F 17/5022 703/28 |
| 2011/0061035 | A1* | 3/2011 | Oishi ................. G06F 17/5022 716/106 |
| 2011/0197172 | A1* | 8/2011 | Yamamoto ....... G01R 31/31836 716/111 |
| 2012/0233587 | A1 | 9/2012 | Rabinovich et al. |

OTHER PUBLICATIONS

M.L. Case et al., "Automated Extraction of Inductive Invariants to Aid Model Checking", Proceedings, FM CAD '07, 2007, pp. 165-172.

R.D. Jeffords et al., "A strategy for Efficiently Verifying Requirements Specifications Using Composition and Invariants", Naval Research Laboratory (Code 5546), Washington DC, NRL Research No. 03-1221.1-1616, ESEC/ FSE '03, Sep. 1-5, 2003, 10 pages.

R.E. Bryant, "Graph-Based Algorithms for Boolean Function Manipulation", IEEE Transactions on Computers, C-35-8, 98(2), pp. 677-691, Aug. 1986, 28 pages.

J.R. Burch et al., "Symbolic Model Checking: 1020 States and Beyond", School of Computer Science, Academic Press, Inc., 1992, pp. 142-170.

"SpyGlass Products," Synopsys, Inc., 2017, 2 pages, [Online] [Retrieved on Mar. 8, 2017] Retrieved from the Internet<URL:https://www.synopsys.com/verification/static-and-formal-verification/spyglass.html>.

"SpyGlass Lint," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-lint.html>.

"SpyGlass CDC," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-cdc.html>.

"SpyGlass RDC," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-rdc.html>.

"SpyGlass DFT ADV," Synopsys, Inc., 2017, 3 pages, [Online] [Retrieved on Mar. 8, 2017] Retrieved from the Internet <URL:https://www.synopsys.com/verification/static-and-formal-verification/spyglass/spyglass-dft-adv.html>.

"SpyGlass Power," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-power.html>.

"SpyGlass Constraints," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-constraints.html>.

* cited by examiner

SYSTEM AND METHOD FOR REACTIVE INITIALIZATION BASED FORMAL VERIFICATION OF ELECTRONIC LOGIC DESIGN

CROSS-REFERENCE TO RELATED APPLICATION

The present application claims priority under 35 U.S.C. 119(e) from prior U.S. provisional application No. 62/146,927, filed on Apr. 13, 2015.

TECHNICAL FIELD

This invention relates to design verification tools for the formal verification of electronic logic design in integrated circuits.

BACKGROUND ART

The relentless increase in the number of transistors integrated on a single electronic chip has made the traditional method of chip verification using simulation more and more difficult and time-consuming. Desiring additional measures of design confidence, chip developers are increasingly turning to other methods of verification to augment simulation.

Formal verification delivers mathematical proofs of correctness without requiring simulation test bench development. Formal verification processes properties defining intended behavior and makes use of constraints that specify legal input values for the design. Properties can be defined by the chip designer in the form of assertion statements. Properties can also be automatically extracted by electronic design automation (EDA) tools. Verification properties often define relationships between signals on different cycles, e.g., if there is a request on cycle N, there should be an acknowledge generated on cycle N+1. To correctly model the environment of a design, designers specify constraints in SystemVerilog assertion (SVA), probabilistic soft logic (PSL), or other standard constraint language formats. The constraints are often referred to as 'assumptions' while the properties to be verified are called 'assertions'.

To prove the correctness of a property, the verification tool often needs to check that one or more parts of the design correctly transition through a sequence of states. In many situations it is computationally infeasible to verify properties starting at the power-on state. If the verification tool is given a constraint specifying a starting state, the verification tool can attempt to verify the property.

Multiple verification tools select initial states by analyzing simulation results. Seawright et al. (U.S. Pat. No. 7,454,324) discuss such a verification tool. Before a logic designer can use such a tool, he or she must develop a simulation test bench, defining tests and test vectors. This takes considerable time and skill on the part of the logic designer in defining test vectors to aid verification.

Due to the intrinsic complexity of the hardware verification problem, existing formal verification tools can often give only an inconclusive 'partial pass' property verification result, meaning that the verification tool could neither prove nor disprove a property.

Logic designers would like to have a verification tool that gives more conclusive results, i.e., a verification tool that reports whether a property either passes or fails. Furthermore, logic designers would like to have a verification tool that does not require any simulation test bench.

SUMMARY DISCLOSURE

A system and method in accord with the present invention verifies properties using reactive initialization to facilitate formal verification of an electronic logic design. It assumes a state machine starting in one of the states referenced by the property then verifies if a part of the logic design transitions through a sequence of states by automatically assigning an initial state value. The system and method also interacts with a correction-unit by providing meaningful feedback of verification failures, making it possible for the correction-unit to correct the failures or add new constraints that allow the verification to complete. Assigning an initial state simplifies the verification of the validity of the remaining states in the sequence, thus making it more likely to reach a conclusive result and consuming less computing resources.

In particular, an integrated circuit design verification system performs an automated method of formally verifying a set of properties expressing intended logic behavior of an integrated circuit is implemented as design verification software running on a computer system. The system comprises a computer processor having access to data storage that stores the design verification software, including a correction-unit for reactive initialization. When executed by the computer processor, the design verification software is operative to perform the steps of the automated method.

The method begins by receiving, by the data storage, a description of at least a portion of an integrated circuit design to be formally verified, a set of properties of the design to be verified, and a set of constraints. Next, the description is analyzed by the processor with respect to each property, determining the reachability of a specified state from a given initial state under conditions specified by the constraints. The analyzing is conducted locally over a set of sub-designs from the received description and computes the number of cycles to reach the specified state. Reaching the specified state and violating any cycle requirement of the property is considered a "failure" of that property for the sub-design and given initial state, while failing to reach the specified state or reaching the specified state without violating any cycle requirement of the property is reported as a "pass" of that property for the sub-design and the given initial state. Whenever such a failure of the analysis is reported, the processor running the correction-unit of the verification software identifies invariant signals from the set of conditions leading to the spurious failure, and then adds a constraint corresponding to the identified invariant signals. Invariant signals may be identified using forward induction from Boolean conditions that hold before and after each computation cycle of the analyzing step leading to the failure. For example, the forward induction may involve performing an over-approximative fix point construction of reachable states in the form of a logical predicate, reachable states being limited to sequential elements in a direct fan-in of the identified signals. The specific property is re-analyzed with the added constraint until reachability is determined.

Initial states for the property may be determined using a bounded model checking proof engine, considering only those sub-designs encoding the property being verified and ignoring any other initial state information. The analyzing with respect to each property can try multiple initial state values in verifying the same property. Additionally, the method and system can detect multi-cycle path exceptions, as well as sequential false path exceptions.

DETAILED DESCRIPTION

Reference Terms

Reactive Initialization Verification System (RIVS): a system and method for verifying properties using reactive initialization.

Reactive Initialization: the verification method assuming a first state or sequence of a property to be true and verifying correctness of the sequence forming the property, applying invariants, reporting a sequential witness to a correction-unit, and receiving feedback from the correction-unit that allows the method to prove the formal rule check.

Formal Property Check: a formal verification of a property.

Multi-Cycle Path Exception Check: a sequential check of signals that ensure a multi cycle timing relation, e.g., launch implies capture 2 cycles later.

Reachability Analysis: a technique for solving sequential model checking problems.

Sequential Model Checking Problem: the problem of checking a sequential model of a system against a specification. This includes checking that a state machine can transition between specified states.

Sequential False Path Check: a check to see if a path can be sensitized when a register's data input toggles.

Sequential Witness: an example that causes a sequential model check to fail.

Witness Generalization: a simplification of a witness to make it easier for a user to understand. Simplification involves invariant removal.

State: a value assignment of registers encoding the state of a state-machine.

Invariant: a condition that is true in all states.

Figure 1:
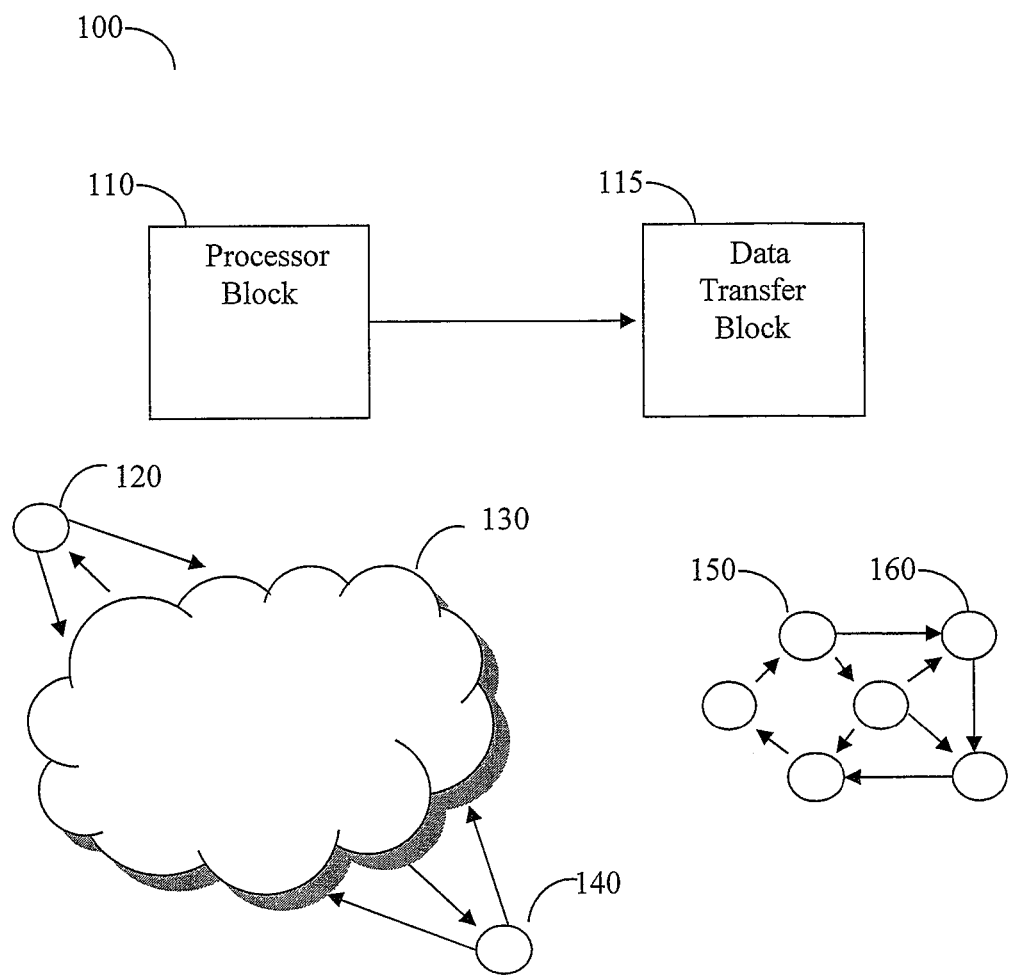
FIG. 1 shows a sample logic design illustrating the need for state initialization.

FIG. 1 shows a sample logic design illustrating the need for state initialization. In diagram 100 a processor block 110 is driving a data transfer protocol (DTP) block 115. In this example the processor block 100 and the DTP protocol block 115 are complex circuits with many logic elements. The operation of the processor block 110 can be seen as a series of state transitions of a finite state machine (FSM). State 120 of the FSM represents the initial power-on-state of the processor. The cloud 130 represents the many states that the processor can assume. State 140 represents the "Start Data Transfer" state of the processor. The processor takes thousands of clock cycles to reach the "Start Data Transfer" state 140 from the power-on state 120. The DTP block 115 can also be seen as an FSM with power-on state 150 and its own,"Start Data transfer" state 160. When the processor block 110 enters the "Start Data Transfer" state 140 it sends a signal to the DTP block 115 causing the DTP block 115 to transition from power-on state 150 to "Start Data transfer" state 160. A verification tool cannot verify the correctness of the DTP block 115 if it has to analyze thousands of cycles starting from the power-on state. The computational requirement to analyze the thousands of cycles is too great.

The reactive initialization verification system (RIVS) proves the correctness of the DTP block 115 by starting from state 160. Starting at state 160 allows the RIVS to prove most DTP properties by analyzing only 1 or 2 cycles. The RIVS simplifies the global verification problem into a local verification problem by replacing the processor block 110 with a primary input. This primary input is assigned a value to cause the DTP to transition to state 160.

Figure 2:
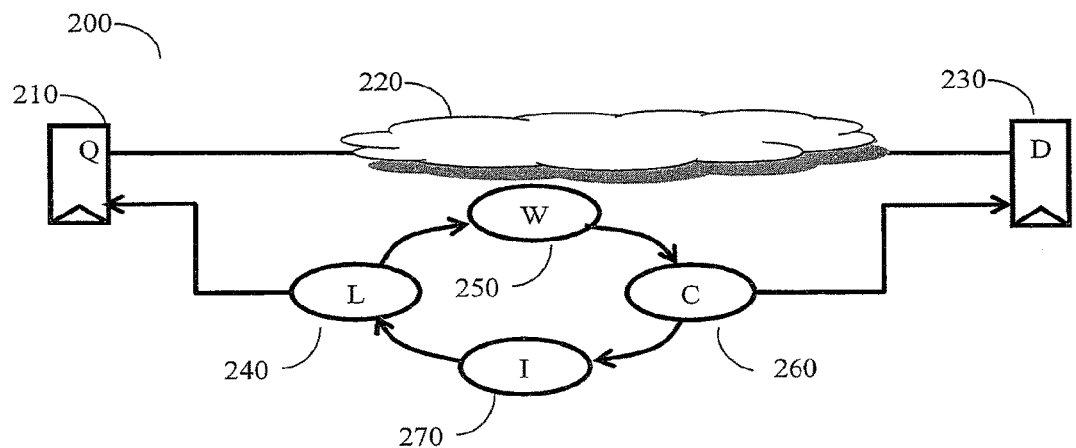
FIG. 2 shows a sample logic design containing a state machine.

FIG. 2 is an exemplary diagram 200 showing sample logic for a data transfer with one FSM. Register 210 is the source of the data transfer and register 230 is its destination. The data from register 210 passes through combinational logic 220 before driving register 230. Elements 240, 250, 260 and 270 represent the states of the FSM controlling the data transfer. The FSM transitions from the "Launch State" 240 to the "Wait State" 250 to the "Capture State" 260 to the "Idle State" 270 and then back to the "Launch State" 240. Each state transition takes one cycle. In the "Launch State" 240 the FSM enables the source register 210. In the "Capture State" 260 the FSM enables the destination register 230.

The user may specify that the combinational logic 220 is a multi-cycle path (MCP) taking more than one cycle. The following SDC constraint specifies an MCP of 2 cycles:

set_multicycle_path-from reg210/Q-to reg230/D 2

The RIVS proves that "Capture State" 260 follows the "Launch State" 240 by 2 cycles to satisfy the MCP. The RIVS proves this quickly by concluding that the FSM always takes 2 cycles to transition between the 2 states. The RIVS does so by forcing verification to start at "Launch State" (compelling event for MCP property), and simply explore 2 cycles starting from the "Launch State".

If the SDC constraint specifies a MCP of 3 cycles, the RIVS will detect a problem. In one embodiment a correction-unit fixes the problem by modifying the design to introduce a second wait state between "Wait state" 250 and "Capture state" 260.

Figure 3:
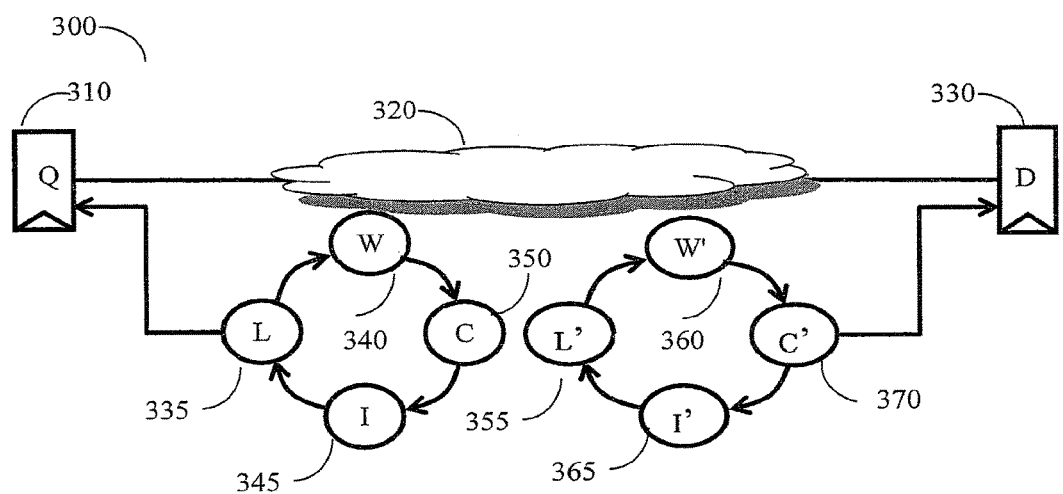
FIG. 3 shows a sample logic design containing two related state machines.

FIG. 3 is exemplary diagram 300 showing sample logic for a data transfer with two FSMs. The data from source register 310 passes through combinational logic 320 before driving destination register 330. Elements 335, 340, 345 and 350 represent the states of a first FSM controlling the data transfer at the source register 310. Elements 355, 360, 365 and 370 reprsent the states of a second FSM controlling the data transfer at the target register 330. It is common practice that designers duplicate FSMs in this manner when the source and destination registers belong to separate logic modules. In one embodiment, the RIVS selects the initial state of the first FSM as "Launch State" 335 and does not specify the initial state of the second FSM. The RIVS gives a failure when checking that capture follows launch by a required number of cycles. The RIVS interacts with a correction-unit that may be a module within the RIVS, a module external to the RIVS, or a logic designer. The RIVS reports the failure information to the correction-unit. The correction-unit reviews the verification results showing that the failure occurred because the 2 FSMs were not synchronized. The correction-unit can then add a constraint to make the FSMs appear to be synchronized.

The correction-unit recognizes that whenever FSM1 is in a specific state FSM2 will be in the equivalent state, e.g., if one is in the "Idle State" the other will be in the "Idle State". The correction-unit establishes this unchanging relationship, called an invariant, and adds a constraint specifying this relationship.

The RIVS supports the verification of many types of circuits in addition to the data transfer protocol discussed in FIGS. 1, 2 and 3. Other examples include clock-domain-crossing handshakes, sequential false path analysis and FIFO underflow and overflow handling. A sequential false path occurs when a data path signal driving a register is always 0 or always 1. A sequential false path can occur when there are 2 enabling AND gates in the data path and one or more FSMs control the 2 AND gates, so that one of the AND gates is always disabling the data. The RIVS checks for sequential false paths by analyzing the state transitions of the FSMs.

Figure 4:
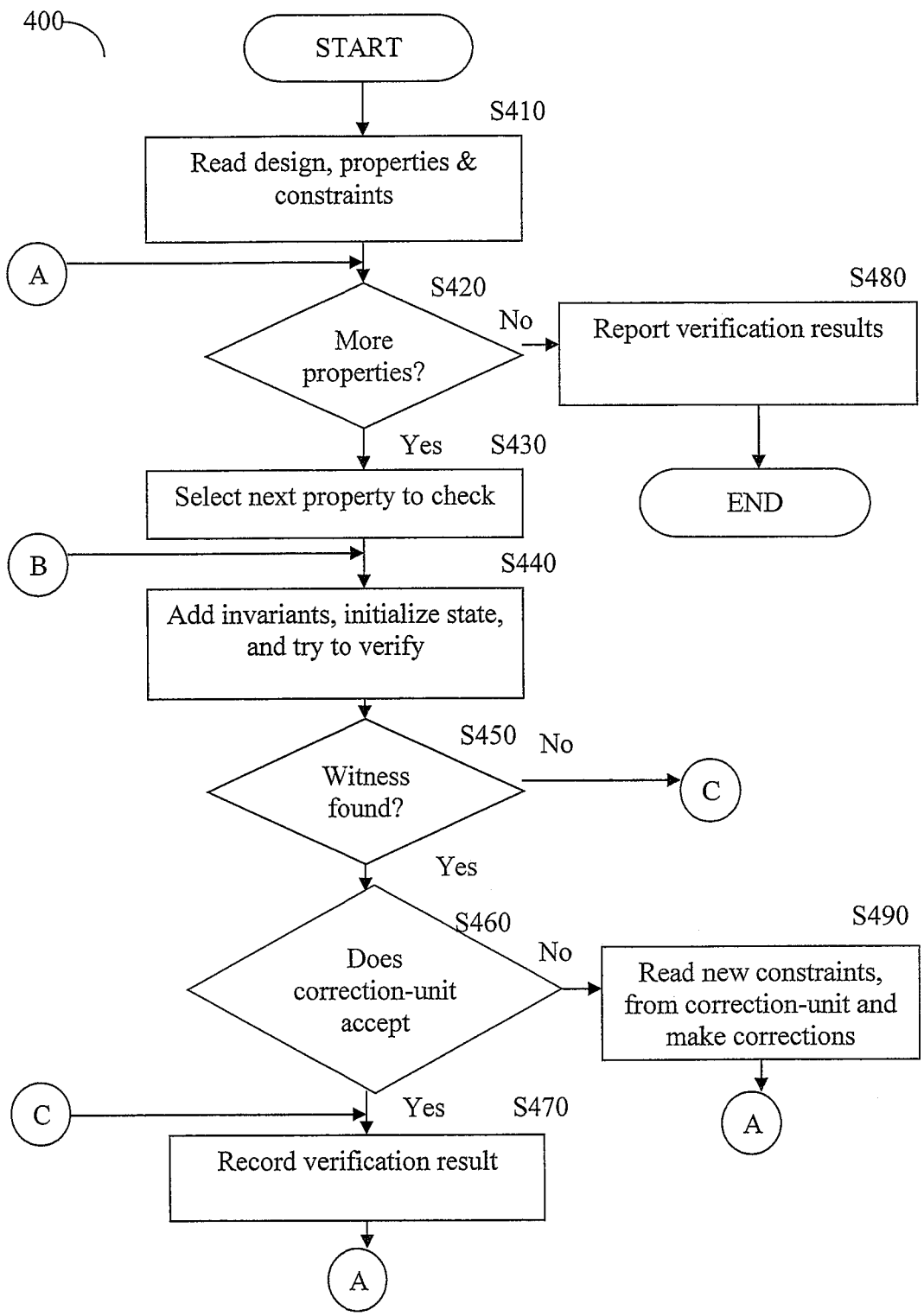
FIG. 4 shows a flowchart outlining the steps for verifying a design using reactive initialization.

Drawing 400 in FIG. 4 shows an exemplary and non-limiting flowchart outlining the steps for verifying a design using reactive initialization according to an embodiment. In S410, RIVS reads the design, the properties and the constraints. In S420, the RIVS starts or continues a loop where it iterates over the properties. The RIVS checks if there are any properties that it hasn't yet processed. If the RIVS has processed all properties in the design, it proceeds to S480; otherwise, it continues at S430. In S430, the RIVS selects the next property.

In S440, the RIVS automatically adds invariants, selects an initial state and attempts to prove the property. If the verification fails, the RIVS reports a set of conditions that cause the failure, called a witness. The RIVS selects the initial state by analyzing the property. To verify a property "A implies B implies C in N cycles" the RIVS initializes the design to a set of states where "A implies B" is holding true. It then verifies if C can be reached in a number of cycles not equal to N and, if no, the property can be claimed as proved correct, otherwise the property is reported as a failure. Essentially, for any property where a sequence of events are asserted, RIVS will initialize the design to states where a first set of sequence is holding true; the verification will then explore if the rest of the sequence can be reached or not, if no the property passes, otherwise the property fails. Choice of number steps in the sequence for initialization can be automatically chosen or dictated by the user.

The RIVS tries to improve the verification results and speed up the verification process by identifying invariant signals. The RIVS strengthens the pre-conditions of the property by adding the identified invariants. After the correction-unit identifies the spurious signals that cause a spurious verification failure, the RIVS automatically adds invariants to prevent this same spurious failure in the future. More precisely, the RIVS strengthens the subsequent bounded reachability check by a forward inductive invariant that adds more information about the relation of the spurious signals. Such an invariant is a Boolean condition that holds before and after each computation step of the design. Thus, every inductive invariant is an over-approximation of the forward reachable states. The stronger an inductive invariant is, the more precise it approximates the reachable states. In one embodiment, the RIVS obtains inductive invariants by performing an over-approximate fix point construction of the globally reachable states. Any technique that provides such an over-approximation in the form of a logical predicate (preferably represented as a circuit-like structure) can be used. The idea is to only consider a few sequential elements in the direct fan-in of the identified signals. As it is necessary to obtain over-approximations, the rest of the design is abstracted out using a cut-based abstraction (replacing boundary signals by primary inputs). A straight forward and well-known way to implement such an approximative fix point construction is to use reduced and ordered binary decision diagrams (BDDs) (cf. Jerry R. Burch, Edmund M. Clarke, Kenneth L. McMillan, David L. Dill, and L. J. Hwang. "Symbolic model checking: 10^20 states and beyond." *Inf. Comput.*, 98(2):142-170, 1992; and Randal E. Bryant. "Graph-based algorithms for Boolean function manipulation." *IEEE Trans. Computers*, 35(8):677-691, 1986).

In one embodiment, the RIVS uses an existing bounded model checking proof engine (BMC) for the actual verification of the property. The key idea is to let BMC determine an initial state that leads to a violation of the property; or to report that no such violating state exists, in which case a proof is reported to the user. This is done by letting BMC only consider the initial state of the monitor sub circuit encoding the property, and by ignoring all other initial state information—including the initial state of the FSM simulating the clocks (the so-called clock FSM). This ensures a valid over-approximating scheme, i.e., compared with the fully initialized global analysis, the RIVS would potentially only report false failures, but surely never false proofs.

Note that by ignoring the design's initialization as described above, the completeness threshold (the maximal length of any shortest counterexample) just corresponds to the state space diameter of the monitor (the maximal length of any unique walk through the states of the monitor), which is usually rather small, as the bounded time horizons of the considered properties are rather small. The RIVS uses the state space diameter of the monitor as the maximum BMC depth: whenever BMC reaches this depth, the RIVS concludes a proof.

Since the monitor runs synchronously to the design, its synchronizations must also be considered when computing its state space diameter. For example, a monitor for checking MCPs synchronizes with clock events to enter a different state. Therefore, a sufficient upper bound of the diameter for MCP monitors is the product of the structural diameter of the monitor automaton itself and the state space diameter of the clock FSM.

Whenever the RIVS finds a violation of the property, it explains the cause in terms of a temporal sequence of signal values leading to the violation. This sequence of signal values is called a counterexample or witness. The RIVS limits the number of signals to simplify the witness and make the failure intelligible to the correction-unit.

Witness simplification removes redundant information (signals and their values) that do not logically contribute to the found violation. Thus, it facilitates the analysis and the selection of spurious signals that should be made more precise in the subsequent bounded analysis. In one embodiment, the witness simplification is based on the method described in "A Toolbox for Counter-Example Analysis and Optimization", Mishchenko & Een & Brayton, 2013. The basic idea is to unroll the sequential circuit logic for the length of the original witness and then to propagate the witness values of the primary inputs as well as the initial values of the sequential elements through the unrolled (i.e., purely combinational) circuit. Now, we only need the signals that represent controlling values to the gates in the unrolled circuit (e.g., when an AND gate reads a 0 and a 1 we only need to consider the cone of influence of the 0 input).

In S450 the RIVS checks the results of the verification performed in S440. If the verification succeeds, the RIVS continues at S470. If the verification fails, the RIVS continues at S460. In S460 the RIVS asks the correction-unit to review the witness. If the correction-unit accepts the witness, the RIVS continues at S470. If the correction-unit rejects the witness, the RIVS continues at S480. In the described embodiment the RIVS processes each property, one at a time, until the verification succeeds or the correction-unit accepts the witness. In a second embodiment the RIVS first verifies each property once, accepting any new correction-unit-specified constraints and corrections. After verifying all properties once, the RIVS verifies all properties again with new correction-unit-specified constraints.

In S470 the RIVS records the results of the verification of the current property and then continues at S420. At S480 the RIVS has finished processing all properties. In S480 the RIVS produces a final verification report showing verification results for each property. After S480 the RIVS finishes.

At S490 the correction-unit has rejected a witness. In S490 the correction-unit reviews the spurious signals causing the witness. The correction-unit corrects the design or enters constraints that restrict the values of the identified spurious signals.

The embodiments disclosed herein can be implemented as hardware, firmware, software, or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit.

Figure 5:
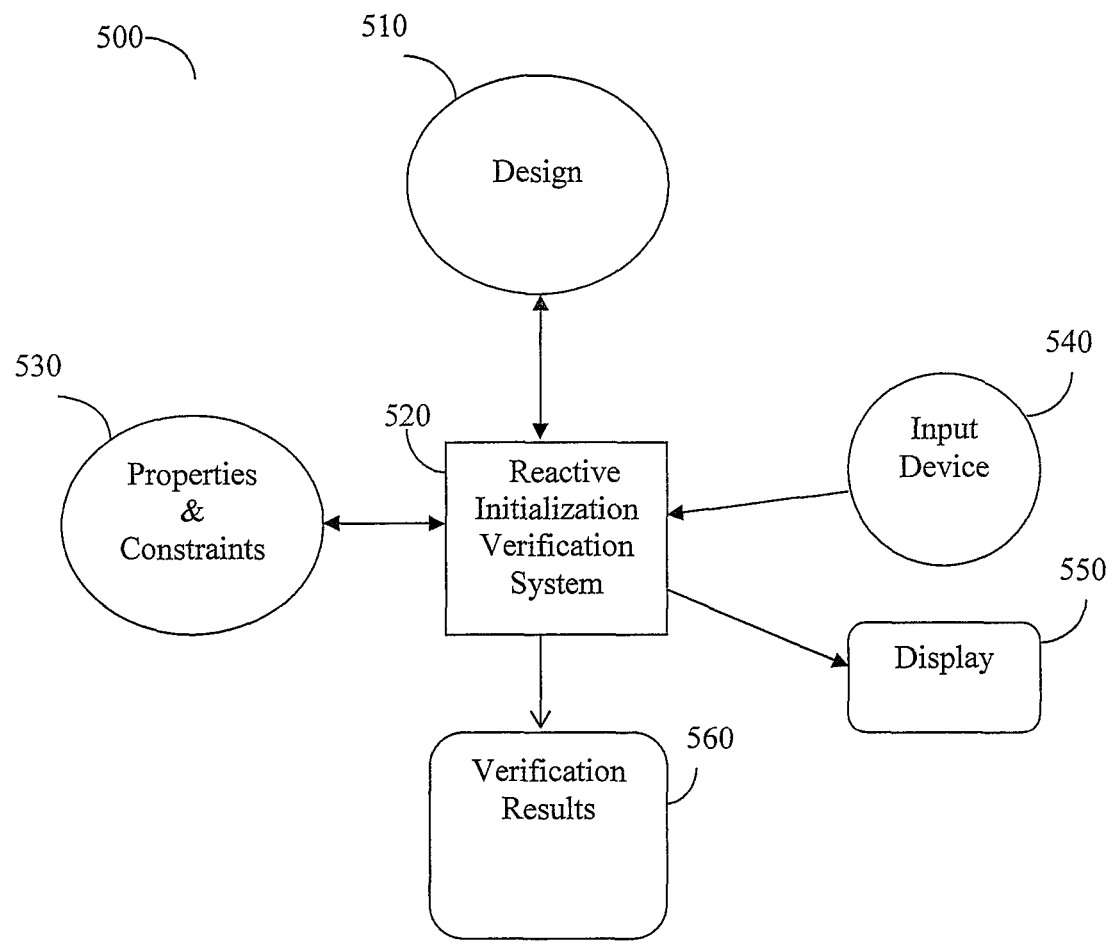
FIG. 5 shows a system for verifying a design using reactive initialization.

For example, FIG. 5 shows an exemplary and non-limiting diagram 500 of one embodiment of a reactive initialization verification system (RIVS) 520. The RIVS 520 runs as an application program on a central processing unit (CPU). The RIVS 520 interacts with an end-user through an input device 540 and a display 550. The RIVS 520 displays partial and complete verification results on the display, 550. An end-user specifies RIVS inputs, starts the RIVS 520 and views results using the input device, 540 and display 550. An end-user views verification results on the display 550. The RIVS 520 reads a design 510 and design properties and constraints 530. The design 510 is typically described in a hardware description language.

The design 510 and design properties and constraints 530 are stored in files on a computer storage device. In one embodiment the RIVS 520 stores the verification results in a file as a report 560.

What is claimed is:

1. An automated method, implemented as design verification software running on a computer system, for formally verifying a set of properties expressing intended logic behavior of an integrated circuit, the method comprising:
   receiving, by a data storage accessible to a processor, a description of at least a portion of an integrated circuit design to be formally verified, a set of properties of the design to be verified and a corresponding set of constraints for the properties, wherein each property defines a sequence of states from a given initial state to a specific state, the sequence to occur under conditions specified by the corresponding constraints and further subject to a cycle requirement; and
   analyzing the description by the processor with respect to each property determining reachability of the specific state from the given initial state under the conditions specified by the corresponding constraints, comprising:
      starting a sub-design from the received description in the given initial state, the sub-design being a portion of the integrated circuit for which the given initial state and the specific state are defined;
      determining whether the sub-design can reach the specific state from the given initial state via the sequence of states under the specified conditions in a number of cycles that violates the cycle requirement;
      a) if the specific state is so reachable in a number of cycles that violates the cycle requirement, reporting a failure of that property for the sub-design and the given initial state, and b) otherwise, reporting a pass of that property for the sub-design and the given initial state;
      if a spurious failure of the analysis is reported, identifying invariant signals from the set of conditions leading to the spurious failure;
      adding a constraint corresponding to the identified invariant signals; and re-analyzing with the added constraint until reachability is determined.

2. The method as in claim 1, wherein the invariant signals are identified using forward induction from Boolean conditions that hold before and after each computation cycle of the analyzing step leading to the spurious failure.

3. The method as in claim 2, wherein forward induction involves performing an over-approximative fix point construction of reachable states in the form of a logical predicate, the reachable states being limited to sequential elements in a direct fan-in of the identified signals.

4. The method as in claim 1, wherein initial states for the reachability checking are determined using a bounded model checking proof engine, considering only an initial event of a sequence representing the property being verified and ignoring any other initial state information.

5. The method as in claim 1, wherein the analyzing with respect to each property tries multiple initial state values in verifying the reachability check.

6. The method as in claim 1, wherein the reachability checking detects false multi-cycle path exceptions.

7. The method as in claim 1, wherein the reachability checking detects false sequential path exceptions.

8. The method as in claim 1, wherein the verification software includes a correction unit for reactive initialization, and identifying invariant signals is made by the correction unit.

9. An integrated circuit design verification system for formally verifying in a circuit design a set of properties expressing intended logic behavior of an integrated circuit, the system comprising a computer processor having access to data storage storing design verification software, wherein the design verification software, when executed by the computer processor, is operative to:
   receive a description of at least a portion of an integrated circuit design to be formally verified, a set of properties of the design to be verified and a corresponding set of constraints for the properties, wherein each property defines a sequence of states from a given initial state to a specific state, the sequence to occur under conditions specified by the corresponding constraints and further subject to a cycle requirement; and
   analyze the description by the processor with respect to each property determining the reachability of the specific state from the given initial state under the conditions specified by the corresponding constraints, comprising:
      starting a sub-design from the received description in the given initial state, the sub-design being a portion of the integrated circuit for which the given initial state and the specific state are defined;

determining whether the sub-design can reach the specific state from the given initial state via the sequence of states under the specified conditions in a number of cycles that violates the cycle requirement;

a) if the specific state is so reachable in a number of cycles that violates the cycle requirement, reporting a failure of that property for the sub-design and the given initial state, and b) otherwise, reporting a pass of that property for the sub-design and the given initial state;

whenever a spurious failure of the analysis is reported, identifying invariant signals from the set of conditions leading to the spurious failure;

adding a constraint corresponding to the identified invariant signals; and re-analyzing with the added constraint until reachability is determined.

10. The system as in claim 9, wherein the invariant signals are identified using forward induction from Boolean conditions that hold before and after each computation cycle of the analyzing step leading to the spurious failure.

11. The system as in claim 10, wherein forward induction involves performing an over-approximative fix point construction of reachable states in the form of a logical predicate, the reachable states being limited to sequential elements in a direct fan-in of the identified signals.

12. The system as in claim 9, wherein initial states for the reachability checking are determined using a bounded model checking proof engine, considering only an initial event of the sequence representing the property being verified and ignoring any other initial state information.

13. The system as in claim 9, wherein the analyzing with respect to each property tries multiple initial state values in verifying the reachability check.

14. The system as in claim 9, wherein the reachability checking detects false multi-cycle path exceptions.

15. The system as in claim 9, wherein the reachability checking detects false sequential path exceptions.

16. The system as in claim 9, wherein the verification software includes a correction unit for reactive initialization, and identifying invariant signals is made by the correction unit.

* * * * *